United States Patent [19]

Skotheim et al.

[11] Patent Number: 5,128,587
[45] Date of Patent: Jul. 7, 1992

[54] ELECTROLUMINESCENT DEVICE BASED ON ORGANOMETALLIC MEMBRANE

[75] Inventors: Terje Skotheim, Shoreham, N.Y.; Yoshiyuki Okamoto, Fort Lee, N.J.; Junji Kido, Yamagata, Japan

[73] Assignee: Moltech Corporation, Stony Brook, N.Y.

[21] Appl. No.: 582,409

[22] Filed: Sep. 13, 1990

[30] Foreign Application Priority Data

Dec. 26, 1989 [JP] Japan .................. 1-334816
Dec. 26, 1989 [JP] Japan .................. 1-334817
Dec. 26, 1989 [JP] Japan .................. 1-334818

[51] Int. Cl.$^5$ .................. H05B 33/14; H05B 33/20
[52] U.S. Cl. .................. 313/504; 313/498
[58] Field of Search .................. 313/499, 498, 504

[56] References Cited

U.S. PATENT DOCUMENTS

| | | | |
|---|---|---|---|
| 4,356,429 | 10/1982 | Tang | 313/504 X |
| 4,720,432 | 1/1988 | Van Slyke et al. | 313/504 X |
| 4,885,211 | 12/1989 | Tang et al. | 313/504 X |

*Primary Examiner*—Palmer C. DeMeo
*Attorney, Agent, or Firm*—Roland Plottel

[57] ABSTRACT

The present invention relates to electroluminescent devices, which may be used as colored display elements in indicator devices or flat plate multicolored displays. Electroluminescent elements can be categorized as natural or injection type. The present invention relates to injection type electroluminescent devices which operate by the application of a current through the system, creating luminescence at a p-n junction.

11 Claims, 1 Drawing Sheet

ELECTROLUMINESCENT DEVICE BASED ON ORGANOMETALLIC MEMBRANE

BACKGROUND OF THE INVENTION

The present invention relates to electroluminescent devices, which may be used as colored display elements in indicator devices or flat plate multicolored displays.

Electroluminescent elements can be categorized as natural or injection type. The present invention relates to injection type electroluminescent devices which operate by the application of a current through the system, creating luminescence at a p-n junction.

Electroluminescene in organic crystals has been investigated by a number of researchers for practical electroluminescent devices [*Materials Science*, 7, 43 (1981)]. The primary reason is that a large number of organic materials are known to have extremely high fluorescence quantum efficiencies in the visible spectrum [*Topics in Applied Physics: Dye Lasers*, (Springer, N.Y., 1977)]. An anthracene single crystal, for example, has been shown to exhibit intense electroluminescence [*Physical Review Letter*, 14, 229 (1965)]. From a practical point of view, however, electroluminescent devices using organic single crystals are less attractive, since drive voltages of 100 Volts or more are necessary for bright emission. Therefore, studies of electroluminescence in organic materials have concentrated on thin film devices.

The electroluminescent element, in the form of a thin film, is placed between two electrodes. By applying a current across the electrodes, electrical energy will be converted directly to light. The electroluminescent element can operate in a wide range of ac or dc frequency and at low voltages with a high rate of conversion of electric energy to light energy. Injection type electroluminescent devices have mainly been constructed with inorganic semiconductors, such as GaP. Tang and VanSlyke recently reported an injection type luminescent diode constructed of two membrane layers, one p-type organic compound and one n-type organic compound [*Applied Physics Letters*, 51 (12), 913(1987)]. The device consisted of a double layer structure with a hole transporting diamine layer and a luminescent aluminum complex. Tang et al also reported that doping the aluminum complex with organic luminescent dyes yields luminescence from the dopant materials with higher quantum efficiency [*Journal of Applied Physics*, 65, 3610 (1989)].

Similar results were obtained by Adachi et al [*Japanese Journal of Applied Physics*, 27, L269 (1988) and *Japanese Journal of Applied Physics*, 27, L713 (1988)]. Their devices consisted of three organic layers, a diamine layer for hole injection, a luminescent organic dye layer, and an electron injection layer. By using appropriate luminescent dyes, they obtained desired luminescent colors such as blue, green and red. Their latest study showed that luminescent materials with hole transporting properties exhibit efficient electroluminescence without a hole transporting diamine layer [*Applied Physics Letters*, 55, 1489 (1989)].

In all these prior art examples, the broad nature of the luminescence spectra of organic dyes result in luminescent colors which are dull and, therefore, not best suited for actual display applications. The emission spectra generally have spectral band widths of 100 to 200 nm. Filters must therefore be used in order to obtain monochromatic light.

It is desirable to obtain bright and efficient electroluminescent devices with narrow luminescent spectral band width.

It is further desirable to obtain electroluminescent devices which can operate at high efficiency and at low voltages.

It is specifically desirable to obtain electroluminescent devices which can be mass produced at low cost and in large areas.

These objects are accomplished by the present invention wherein the luminescence element consists of a thin film of an organometallic compound of the lanthanide series is interposed between two electrodes, one of which is transparent to visible light.

The present invention covers a class of electroluminescent materials with exceptionally narrow spectra emission bands which provide bright colors when incorporated in an electroluminescent device. Further improvement in the design is achieved by interposing a hole conducting layer between the luminescent material and the transparent electrode. A key aspect of the invention is to use as electroluminescent layer organometallic complexes with rare-earth elements of the lanthanide series.

One aspect of the invention is to provide an electroluminescent thin film consisting of an organometallic complex of rare-earth elements of the lanthanide series sandwiched between a transparent electrode of high work function and a second electrode of low work function. In another aspect of the invention, a hole conducting layer is interposed between the electroluminescent layer and the transparent, high work function electrode. In yet another aspect of the invention, an electron conducting layer is interposed between the electroluminescent layer and the electron injecting, low work function electrode.

An object of the invention is to provide an electroluminescent device with narrow band emission spectrum to provide bright emission in the visible region of the spectrum upon the application of a voltage.

A further object of the invention is to provide an electroluminescent device of the above described type in which the luminescent element is sandwiched between a transparent electrode of high work function and an electrode of low work function.

A further object of the invention is to provide an electroluminescent device of the above type which operates at low voltages.

A further object of the invention is to provide a transparent hole conducting layer interposed between the electroluminescent element and the transparent, high work function electrode.

A further object of the invention is to provide an electron conducting layer interposed between the electroluminescent element and the low work function electrode.

A further object of the invention is to provide an electroluminescent device wherein the electroluminescent element, the hole conducting element, the electron conducting element and the electrodes are in the form of thin films which can be fabricated to cover large areas.

BRIEF DESCRIPTION OF THE DRAWINGS

The invention will be further described with reference to the accompanying drawings, in which.

DETAILED DESCRIPTION OF THE INVENTION

Figure 1:
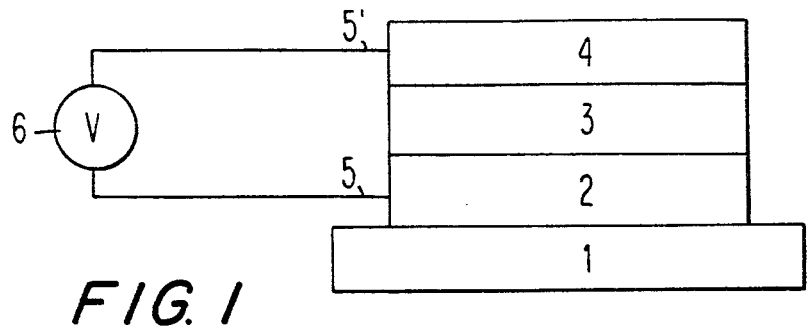
FIG. 1 is a schematic diagram partially showing a cross section of an electroluminescent device in which 1 is a glass substrate, 2 is a transparent electrode, 3 is an electroluminescent element, 4 is a second electrode, 5 and 5' are electrical contacts to the electrodes, and 6 is a power supply which provides a voltage across the electrodes.

The electroluminescent device of the present invention is characterized by the emission of visible light with a narrow spectral band. The narrow band emission derives from the use of electroluminescent materials consisting of rare-earth organometallic compounds.

The preferred organometallic compounds are of the lanthanide series, which is characterized by highly efficient luminescence in exceptionally narrow emission bands. The lanthanide series elements used are the following: Y, La, Ce, Pr, Nd, Pm, Sm, Eu, Gd, Tb, Dy, Ho, Er, Tm, Yb, Lu. The +2, +3, and +4 cations of these elements can be used to make organometallic compounds.

Organic compounds which can be used as organic ligands are compounds which have beta-diketone functional groups such as acetylacetone, dibenzoylmethane, 2-thenoyltrifluoroacetone; organic compounds which have carboxylic groups such as o-benzoyl benzoic acid, salicylic acid, o-phthalic acid; organic compounds which have ketone or aldehyde groups adjacent to hydroxy groups, such as salicyl aldehyde, o-hydroxyacetonephenone or o-hydroxybenzophenone; oxine analogues such as 8-hydroxyquinoline or 5,7-dibromo oxine; pyridine analogues such as 2,2'-dipyridine, 2,2'2''-tripyridine, 1,10-phenanthroline and cryptates and crown ethers. These ligands can also be combined, using more than one ligand in the same device.

The organometallic electroluminescent compounds are applied in the form of a thin film which can be amorphous or crystalline. The preferred thickness of the film is 50–500 Å, but thicknesses of <50 Å or >500 Å are also applicable. The film can be formed efficiently by vacuum evaporation, sublimation, chemical vapor deposition or solvent casting.

The first, or hole injecting, electrode is a transparent electrode with high work function to efficiently inject holes into the luminescent element. Preferred electrode materials are oxides, such as tin oxide or indiumtinoxide, or thin transparent metal films.

The second, or electron injecting, electrode is a low work function metal, metal salt or alloy, such as Mg, Li, Na, K, Ca, Rb, Sr, Ce, alkali earth metals, rare earth elements, Mg-Ag alloys, Cs-O-Ag, $Cs_3Sb$, $Na_2KSb$, or $CsNa_2Sb$.

In the preferred embodiment of the invention, a charge injection layer, capable of transporting holes, is interposed between the transparent, high work function electrode and the luminescent film. The hole injection layer can be composed of organic amines, conducting polymers, such as polypyrrole and polythiophene, or inorganic semiconducting materials, such as C, Ge, Si, Sn, SiC, AlSb, BN, BP, GaN, GaSb, GaAs, GaP, InSb, InAs, InP, CdSe, CdTe, ZnO, ZnS, ZnSe. The semiconducting layer can be amorphous or crystalline and doped p-type for hole conduction.

In another preferred embodiment of the invention, a charge injection layer, capable of transporting electrons, is interposed between the low work function electrode and the luminescent film. The electron injection layer can be composed of organic or inorganic semiconductors, such as 3,4,9,10-perylene tetracarboxylic-bis-benzimidazole, Ge, Si, Sn, SiC, AlSb, BN, BP, GaN, GaSb, GaAs, GaP, InSb, InAs, InP, CdSe, CdTe, ZnO, ZnS, ZnSe. The semiconducting layer can be amorphous or crystalline, and doped n-type for electron conduction unless it is intrinsically n-type.

The inorganic semiconductor films can be produced with standard thin film deposition techniques, such as photoassisted chemical vapor deposition (CVD), plasma assisted CVD, metallorganic CVD, and molecular beam epitaxy. The organic hole conducting and electron conducting films can be produced by solution casting, electrochemical deposition, sublimation or thermal vacuum evaporation.

The elements of the present invention can be layered alternately: electrode-electroluminescent element-electrode-electroluminescent element-electrode- . . . etc. The structure of the element can be varied to adjust the color tone or the variation of color.

The manner in which the electroluminescent devices are constructed can be understood more fully by reference to the following illustrative examples.

EXAMPLE 1

In the following embodiment of the present invention the first, or hole injecting, electrode was a transparent conducting electrode consisting of 800 Å of indium-tin-oxide (ITO) deposited on a glass substrate followed by the deposition of 200 Å of $Sn_2O$. The luminescence layer was 600 Å of Terbium acetylacetonate ($Tb(acac)_3$) deposited by thermal vacuum evaporation. The second, electron injecting, electrode was Mg deposited by electron beam evaporation.

Referring to the drawings, FIG. 1 shows the structure of the electroluminescent device. When a DC potential greater than 10 V was applied across the device, a bright green luminescence was observed.

EXAMPLE 2

The first electrode was deposited as in Example 1. A 600 Å thick film consisting of a mixture of $Tb(acac)_3$ and lubrane was deposited on top of the transparent oxide electrode by thermal vacuum evaporation, followed by the deposition of a Mg second electrode by electron beam evaporation. The area of the Mg electrode was 1 $cm^2$.

When a DC potential greater than 10 V was applied, a bright yellow luminescence of high intensity was observed. The luminescence emission was stable.

EXAMPLE 3

The first electrode was deposited as in Example 1. 150 Å p-type amorphous hydrogenated silicon carbide (a-SiC:H) was deposited on top of the transparent oxide electrode. The luminescence layer was a 600 Å thick film of Tb(acac)$_3$ deposited by thermal evaporation followed by the deposition of a Mg electrode deposited by electron beam evaporation.

Figure 2:
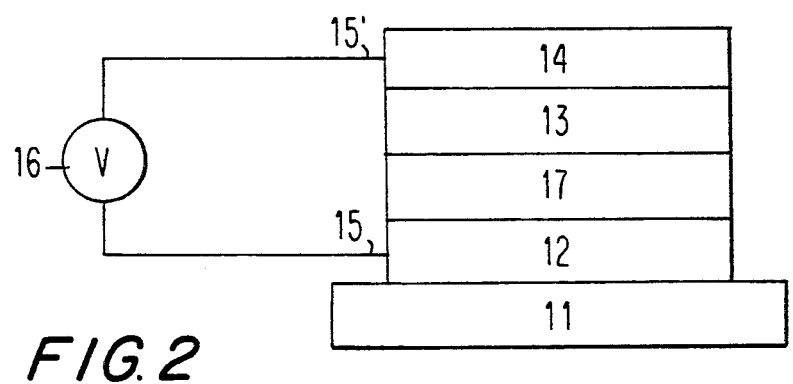
FIG. 2 is a schematic diagram partially showing the cross section of another embodiment of the invention in which 11 is a glass substrate, 12 is a transparent electrode, 13 is an electroluminescent element, 14 is a second electrode, 15 and 15' are electrical contacts to the electrodes, 16 is a power supply which provides a voltage across the electrodes, and 17 is a hole transporting layer.

Referring to the drawings, FIG. 2 shows the structure of the electroluminescent device. When a DC potential greater than 10 V was applied across the device, a bright green luminescence was observed. In this luminescence device, when the ITO electrode is positive and the Mg electrode negative, the electric current through the device increased as the potential increased. With opposite polarity, no current was observed. These characteristics are similar to those of diodes. The intensity of the luminescence light was greater than in Example 1, and the intensity did not decrease with time.

EXAMPLE 4

The construction of this device is the same as in Example 2, except that a 150 Å p-type a-SiC:H films was deposited on the ITO electrode prior to the deposition of the luminescence layer, as in FIG. 2. The device showed diode characteristics as in Example 3. When a 10 V potential is applied such that the ITO electrode is positive, bright yellow luminescence was observed. The intensity of the light was greater than in Example 2, and the intensity did not decrease with time.

EXAMPLE 5

The construction of the device is the same as in Example 1, except that a thin film of electrochemically polymerized polythiophene was deposited on the ITO electrode prior to the deposition of the luminescence layer. When a 12 V potential was applied, bright green luminescence was observed. The intensity of the light was approximately the same as in Example 1, and the intensity decreased slightly with time.

EXAMPLE 6

The first electrode was a 5000 Å thick ITO film deposited as in Example 1. A hole conducting layer consisting of a 400 Å thick film of triphenyldiamine was deposited on the ITO electrode by thermal vacuum evaporation. The luminescence layer, consisting of 600 Å of Tb(acac)$_3$ was subsequently deposited by thermal vacuum evaporation, followed by the deposition of an Al second electrode deposited by thermal vacuum evaporation. The area of the Al electrode was 1 cm$^2$. The construction of the device is shown schematically in FIG. 2.

Figure 3:
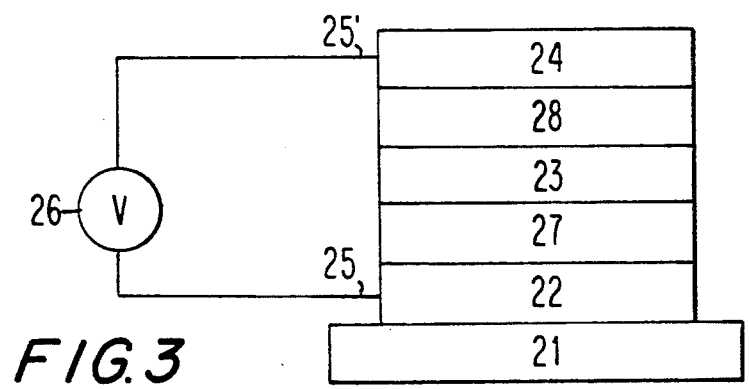
FIG. 3 is a schematic diagram partially showing the cross section of another embodiment of the invention in which 21 is a glass substrate, 22 is a transparent electrode, 23 is an electroluminescent element, 24 is a second electrode, 25 and 25' are electrical contacts to the electrodes, 26 is a power supply which provides a voltage across the electrodes, 27 is a hole transporting layer, and 28 is an electron transporting layer.

When a potential of greater than 10 V was applied across the device, bright green luminescence was observed. The wavelength of the maximum of the luminescence spectrum was 545 nm, and the width of the spectrum was approximately 10 nm. The luminescence spectrum is shown in FIG. 3. The conversion rate of electrons to photons was 2%.

EXAMPLE 7

Using the same construction as in Example 6, when 8-hydroxyquinoline (Al(ox)$_3$) was used in stead of Tb(acac)$_3$ to form the luminescence layer, green luminescence was observed when greater than 10 V was applied across the device. The wavelength of the luminescence maximum was 520 nm. The spectrum was broad, ranging from 480 to 620 nm and the color was dull. The spectrum is shown in FIG. 3. The electron to photon conversion rate was 1%.

EXAMPLE 8

The construction was the same as in Example 6, except that the 600 Å thick luminescence layer consisted of a mixture of Tb(acac)$_3$ and Al(ox)$_3$. The luminescence layer was deposited by thermal vacuum evaporation.

When a potential greater than 10 V was applied across the device, a bright green luminescence was observed. The luminescence had a maximum intensity at 545 nm, corresponding to luminescence from the Tb(acac)$_3$ component. The electron to photon conversion rate was 3.5%.

EXAMPLE 9

The construction was the same as in Example 6, except that the luminescence element consisted of a bilayer formed by thermal vacuum evaporation of a 200 Å layer of Tb(acac)$_3$ followed by thermal vacuum evaporation of a 400 Å layer of Al(ox)$_3$. With the application of a potential greater than 10 V across the device, a bright green luminescence was observed. The luminescence spectrum had a maximum at 545 nm and a band width of 10 nm. The electron to photon conversion rate was 3%.

Attached hereto are copies of the four Japanese priority applications which are incorporated by reference and made part of this application.

What is claimed is:

1. An electroluminescent device for emitting highly monochromatic light, said electroluminescent device comprising in sequence:
   (a) a substrate which is transparent to visible light,
   (b) a first electrode which is transparent to visible light,
   (c) a hole conduction layer which is transparent to visible light,
   (d) a luminescence layer containing organometallic complexes of the lanthanide series,
   (e) a second electrode.

2. The electroluminescent device of claim 1, wherein the substrate is glass.

3. The electroluminescent device of claim 1, wherein the transparent first electrode is a thin film of an electrically conducting oxide.

4. The electroluminescent device of claim 1, wherein the hole conducting layer is an organic or inorganic p-type semiconductor.

5. The electroluminescent device of claim 1, wherein the organometallic complexes are imbedded in a membrane consisting of compounds capable of forming coordination complexes with the excited state of said organometallic complexes.

6. The electroluminescent device of claim 5, wherein the luminescent element is a bilayer consisting of a first layer of said organometallic complexes and a second layer consisting of said membrane.

7. The electroluminescent device of claim 1, wherein the second electrode is a low work function metal.

8. The electroluminescent device of claim 4, wherein the hole conducting layer is selected from organic amines, amorphous hydrogenated silicon amorphous hydrogenated SiC, microcrystalline SiC or conducting organic polymers.

9. The electroluminescent device of claim 1, wherein the organometallic complexes contain lanthanide elements selected from Ce, Pr, Nd, Pm, Sm, Eu, Tb, Dy, Ho, Er, Tm and Yb.

10. The electroluminescent device of claim 5, wherein the organometallic complexes are imbedded in a membrane selected from rubrene, p-terphenyl, 2,5-diphenyloxazole, cyanine dyes, aromatic amines or 8-hydroxyquinoline aluminum.

11. The electroluminescent device of claim 1, wherein the second electrode is selected from Al, Mg, Li, or Mg-Ag alloys.

* * * * *